(12) United States Patent
Tiwari et al.

(10) Patent No.: US 8,135,551 B2
(45) Date of Patent: Mar. 13, 2012

(54) ROBUST ON LINE STATOR TURN FAULT IDENTIFICATION SYSTEM

(75) Inventors: Arvind Kumar Tiwari, Bangalore (IN); William James Premerlani, Scotia, NY (US); Somakumar Ramachandrapanicker, Karnataka (IN); Bhaskar Sen, Bangalore (IN); Bogdan Z. Kasztenny, Markham (CA); Arijit Banerjee, Bangalore (IN)

(73) Assignee: General Electric Company, Niskayuna, NY (US)

( * ) Notice: Subject to any disclaimer, the term of this patent is extended or adjusted under 35 U.S.C. 154(b) by 510 days.

(21) Appl. No.: 12/365,114

(22) Filed: Feb. 3, 2009

(65) Prior Publication Data
US 2010/0194323 A1   Aug. 5, 2010

(51) Int. Cl.
*G01R 31/00* (2006.01)
(52) U.S. Cl. .......... 702/58; 318/490; 318/690; 318/700; 318/727; 324/522; 324/500; 324/546; 324/76.38; 702/57; 702/72
(58) Field of Classification Search .......... 318/490, 318/690, 700, 727; 324/750.02, 537, 544, 324/545, 546, 765.01; 702/58; 340/648
See application file for complete search history.

(56) References Cited

U.S. PATENT DOCUMENTS

| | | | |
|---|---|---|---|
| 5,270,640 A | 12/1993 | Kohler et al. | |
| 5,419,978 A * | 5/1995 | Landau | 429/410 |
| 5,477,163 A * | 12/1995 | Kliman | 324/756.06 |
| 5,514,978 A * | 5/1996 | Koegl et al. | 324/750.02 |
| 5,592,393 A * | 1/1997 | Yalla | 700/293 |
| 5,786,708 A * | 7/1998 | Premerlani et al. | 324/765.01 |
| 6,041,287 A | 3/2000 | Dister et al. | |
| 6,141,196 A * | 10/2000 | Premerlani et al. | 361/78 |
| 6,172,509 B1 | 1/2001 | Cash et al. | |
| 6,236,227 B1 | 5/2001 | Kliman et al. | |
| 6,236,947 B1 | 5/2001 | Dowling et al. | |
| 6,611,771 B1 | 8/2003 | Habetler et al. | |
| 6,636,823 B1 * | 10/2003 | Unsworth et al. | 702/115 |
| 7,127,373 B2 | 10/2006 | House et al. | |
| 7,952,318 B2 * | 5/2011 | Lu et al. | 318/806 |

OTHER PUBLICATIONS

Sottile, Joseph Jr.; An On-Line Method to Detect Incipient Failure of Turn Insulation in Random-Wound Motors; IEEE Transactions on Energy Conversions, vol. 8, No. 4, Dec. 1993.
PCT International Search Report dated Jul. 5, 2010 and Written Opinion.

* cited by examiner

*Primary Examiner* — Rita Leykin
(74) *Attorney, Agent, or Firm* — Richard A. DeCristofaro

(57) ABSTRACT

A system and method for identifying turn faults in a stator of a motor are provided. The method includes determining a normalized cross-coupled impedance from the symmetrical components of measured voltages and currents of the motor. Additionally, the normalized cross-coupled impedance may be normalized to a negative sequence impedance. The negative sequence impedance may be determined through a regression analysis using parameters of the motor, such as line-to-line voltage, horsepower, and number of poles. A system is provided that includes a device having a memory and processor configured to determine a normalized cross-coupled impedance, compare the normalized cross-coupled impedance to one or more thresholds, and trigger and alarm and/or trip the motor.

20 Claims, 6 Drawing Sheets

ROBUST ON LINE STATOR TURN FAULT IDENTIFICATION SYSTEM

BACKGROUND

The invention relates generally to detecting turn faults in the stator of alternating current (AC) induction motors.

AC induction motors are used in a wide array of applications and processes. An AC induction motor typically includes a stationary portion, a "stator," and a rotating portion, a "rotor." In a 3-phase AC motor, power is applied to the stator to induce a magnetic field, causing the rotor to turn and generate mechanical energy. The stator may include any number of "windings," or wound poles that carry the current necessary to induce the magnetic field. These windings may also be characterized by the "turns" in the windings.

In many environments, the windings in the stator are subject to shorts between the turns of the windings, commonly referred to as "turn faults." Depending on the material used for the windings and the insulation, any number or types of failures may occur. Such failures may be mechanical, chemical, or electrical, and may result from degradation of the insulation, the winding material, a manufacturing defect, etc. These turn faults gradually result in extended failures of the windings and eventually result in failure, leading to replacement or repair of motor components or the motor itself. The repair or replacement of the motor or motor components may be unforeseeable and create undesirable downtime in the application or process using the motor when the motor is taken offline.

BRIEF DESCRIPTION

A method for determining turn faults in an induction motor is provided. The method includes determining a negative sequence voltage, determining a negative sequence current and a positive sequence current, determining a negative sequence impedance, determining a normalized cross-coupled impedance from the negative sequence voltage, negative sequence current, positive sequence current, positive sequence voltage, and negative sequence impedance, and determining whether the normalized cross-coupled impedance indicates the presence of a turn fault.

A system for determining turn faults in an induction motor is provided that includes a device, such as a protective relay or a meter, coupled to the induction motor and configured to determine a negative sequence voltage, a negative sequence current, a positive sequence voltage and a positive sequence current, wherein the device includes a memory. The memory includes instructions for determining a normalized cross-coupled impedance, wherein the normalized cross-coupled impedance comprises an impedance normalized by the negative sequence impedance or positive sequence impedance, and determining the normalized cross-coupled impedance indicates the presence of a turn fault.

A manufacture comprising a tangible computer-readable medium is provided. The tangible computer-readable medium includes code adapted for determining a negative sequence current and a positive sequence current, determining a negative sequence impedance, determining a normalized cross-coupled impedance from the negative sequence voltage, negative sequence current, positive sequence current, positive sequence voltage and negative sequence impedance, and determining whether the normalized cross-coupled impedance indicates the presence of a turn fault.

Another method is provided that includes determining a normalized cross-coupled impedance, comparing the normalized cross-coupled impedance to a first threshold, and if the normalized cross-coupled impedance is greater than the first threshold, triggering a first alarm.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
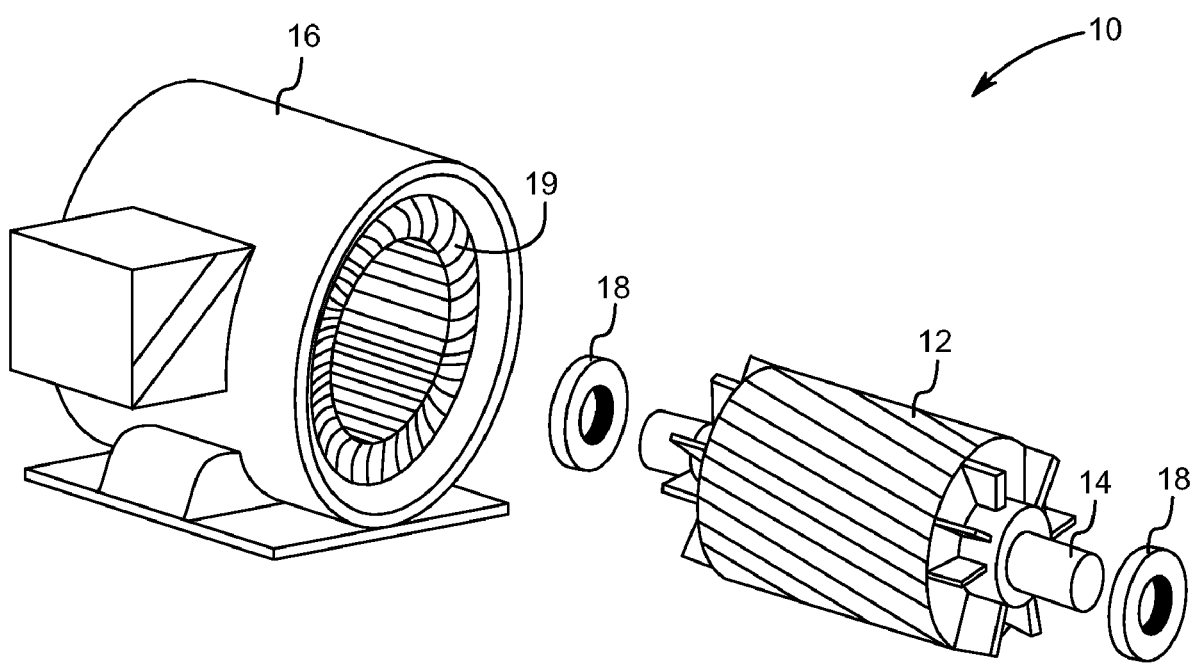
FIG. 1 is a diagrammatical perspective illustration of an induction motor in accordance with an embodiment of the present invention.

FIG. 1 is a diagrammatical perspective illustration of an induction motor 10. FIG. 1 is provided for illustrative purposes only, and embodiment of the present invention are not limited to any specific induction motor or configuration thereof. In the illustrated example, the motor 10 includes a rotor assembly 12, which includes a rotor shaft 14 extending through a rotor core. The rotor assembly 12 along with the shaft 14 can rotate inside the stator assembly 16. Bearing assemblies 18 that surround the rotor shaft 14 may facilitate such rotation within the stator assembly 16. The stator assembly 16 includes a plurality of stator windings 19 that extend circumferentially around and axially along the rotor shaft 14 through the stator assembly 16. During operation, a rotating magnetic field induced in the stator windings 19 reacts with the induced current in the rotor assembly 12 to cause the rotor assembly 12 to rotate, converting electrical energy to mechanical energy output through the shaft 14. In some embodiments, the motor 10 is a synchronous motor, and in other embodiments, the motor 10 is an asynchronous motor. Synchronous motors rotate at exactly the source frequency scaled up by the pole pair count, while asynchronous motors exhibit a slower frequency characterized by the presence of slip.

The stator windings 19 may be any suitable conducting material, such as copper wire, and may include insulation between the windings and other parts of the stator assembly 16. The windings 19 may be susceptible to chemical, mechanical, or electrical degradation that affects the performance of the stator assembly 16, which in turn affects the rotor assembly 12 and the energy output by the motor 10. Manufacturing defects may also cause poor performance of the windings 19. Turn faults in the windings 19 may interfere with current flow and the magnetic field induced in the stator assembly 16. Though the operation of the motor 10 is explained with a simple diagram, examples of the motor 10 are not limited to this particular simple design. Other more complicated designs are also applicable and may benefit from the techniques discussed in detail below.

Figure 2:
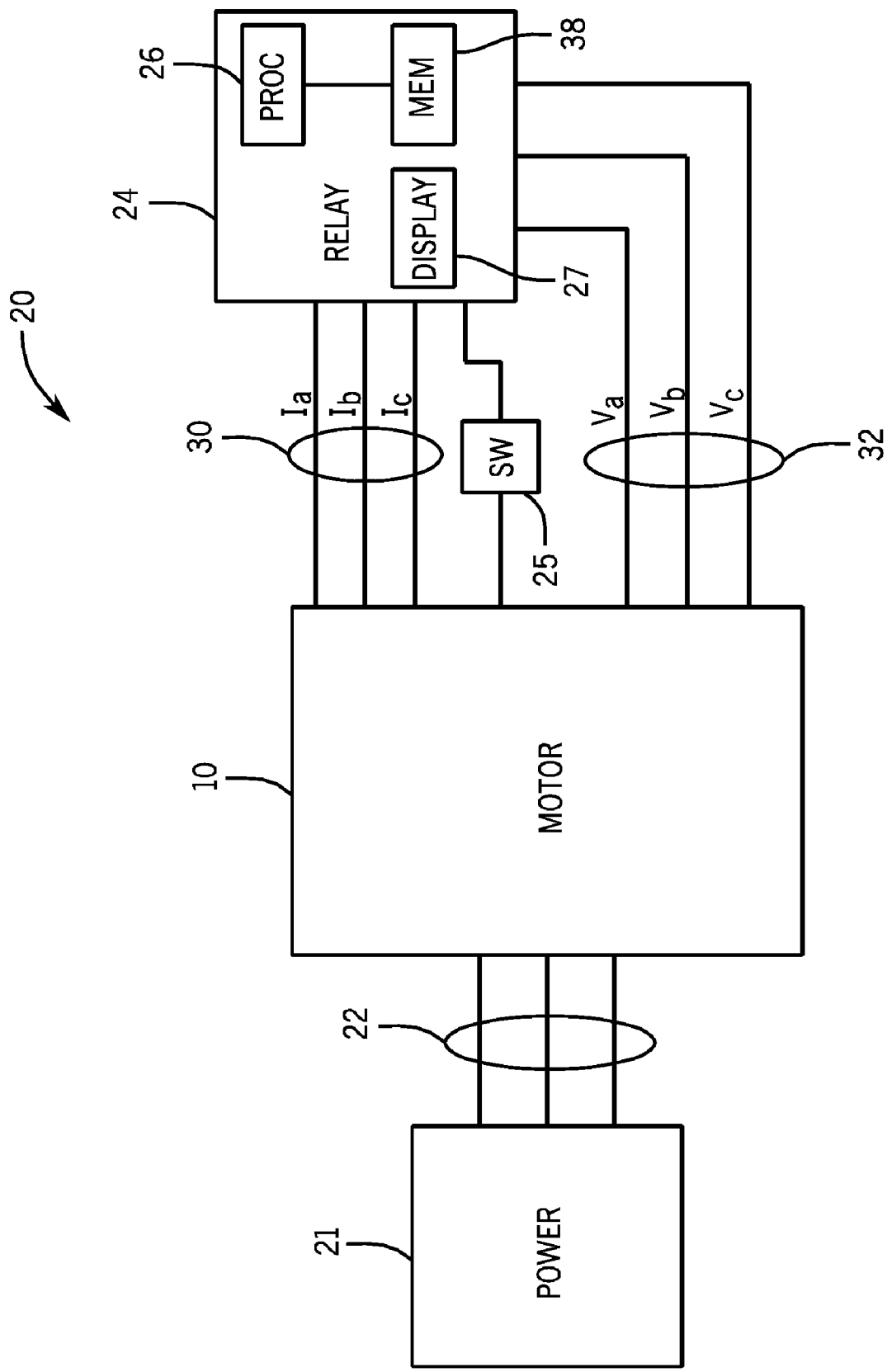
FIG. 2 is a block diagram of a system that includes the induction motor of FIG. 1 in accordance with an embodiment of the present invention.

FIG. 2 is a block diagram of a system 20 that includes the induction motor 10 of FIG. 1. The induction motor 10 may be coupled to a three-phase power source 21, such as an AC mains or other source of AC power. The three-phase AC power is delivered to the induction motor 10, as indicated by lines 22. To control and monitor the motor 10, a device 24, such as a relay, meter, or any other suitable device, may be coupled to the motor 10. It should be appreciated that the device 24 may include components of, or may be, a computer. For example, as depicted in FIG. 2, the device 24 includes a processor 26 and a memory 28. The memory 28 may be any suitable volatile memory, non-volatile memory, or combination thereof. The memory 28 may store any parameters, algorithms, or other data for controlling and monitoring the motor 10, and allow access to this data by the processor 26.

The device 24 may monitor various parameters of the induction motor 10. For example, the device 24 may be coupled to various monitoring components, such as sensors, transformers, etc., in the induction motor 10 that monitor current, voltage, or any other parameter. As indicated by lines 30, the device 24 may receive motor phase current from the motor 10. Additionally, as indicated by lines 32, the device 24 may receive motor phase voltage from the motor 10. It should be appreciated that various signal processing components may be included in the device 24 or between the motor 10 and the device 24, such as signal conditioners, amplifiers, filters, etc. The device 24 may also include a switch 25 to turn the motor on and off. As explained further below, the device 24 may shutdown the motor 10 via the switch 25 in response to a turn fault. The device 24 may also include a display 27. The display 27 may include visual and/or audio display capability.

As will be appreciated, the device 24 may also convert the received three-phase parameters to symmetrical components, e.g., positive sequence (p) components, negative sequence (n) components, and zero sequence (0) components. For example, each phasor for three-phase current Ia, Ib, and Ic may be converted to symmetrical components $I_p$, $I_n$, and $I_0$. Similarly, each phasor of the three-phase voltages $V_a$, $V_b$, and $V_c$ may be converted to symmetrical components $V_p$, $V_n$, and $V_0$.

FIGS. 3-6 illustrate techniques for determining turn faults of the stator assembly 16 of the motor 10. In an embodiment, a normalized cross-coupled impedance may be determined as an indication of the number of turn faults in the stator assembly 16. As described further below, the normalized cross-coupled impedance may be determined from various parameters of the motor 10, such as negative sequence voltage, negative sequence current, positive sequence current, positive sequence voltage and negative sequence impedance.

Figure 3:
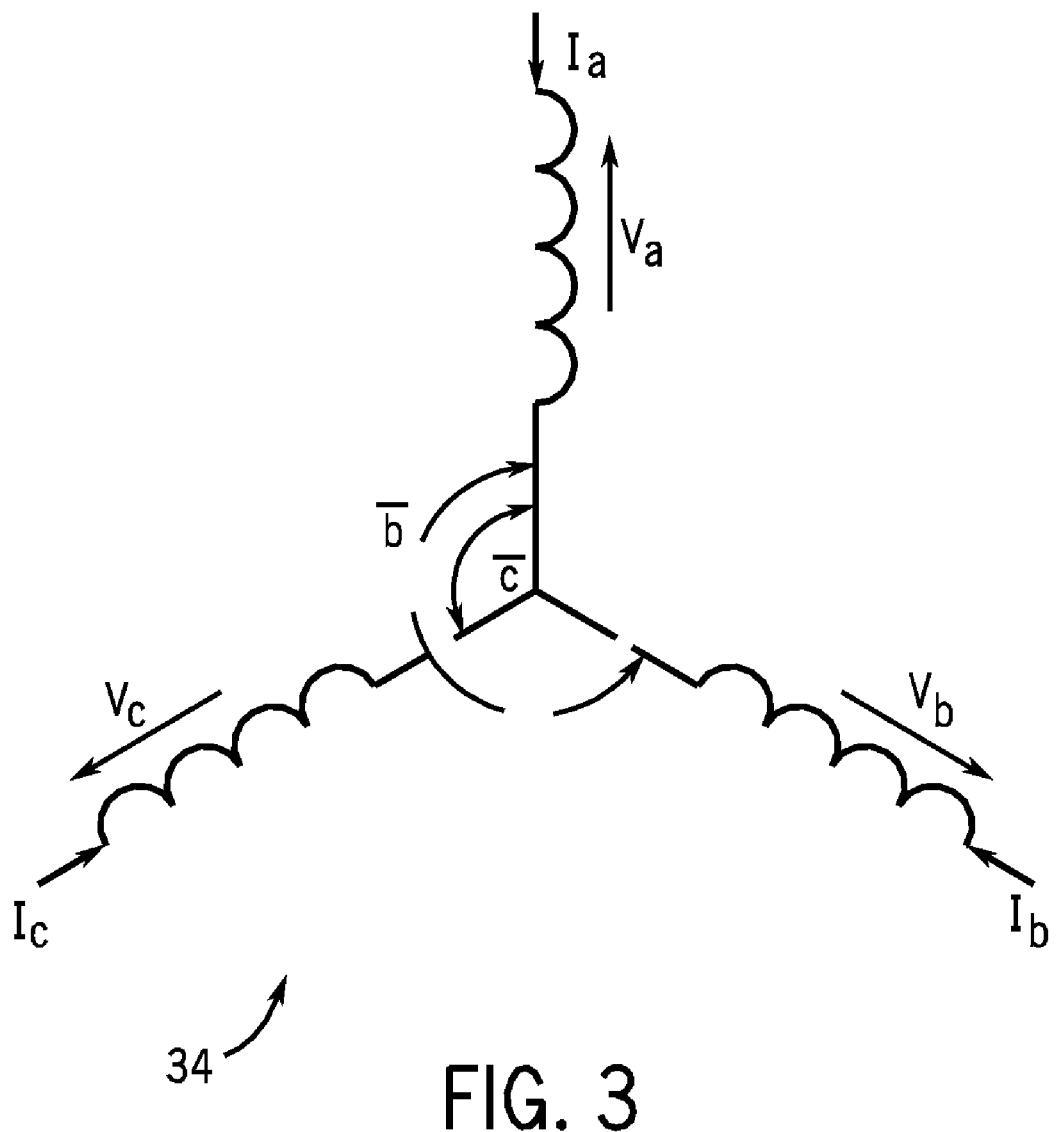
FIG. 3 is a diagram illustrating the voltages and currents of a primary stator winding of a general polyphase winding.

FIG. 3 depicts a primary stator winding 34 of a general polyphase winding, illustrating the three phase voltages, $V_a$, $V_b$, and $V_c$, and three-phase currents $I_a$, $I_b$, and $I_c$. As will be appreciated, the relationship between the voltages, currents, and impedances of a three-phase winding may expressed as follows:

$$V_a = Z_{aa}I_a + Z_{ab}I_b + Z_{ac}I_c$$

$$V_b = Z_{bb}I_b + Z_{bd}I_a + Z_{bc}I_c$$

$$V_c = Z_{cc}I_c + Z_{ca}I_a + Z_{cb}I_b \qquad (1)$$

where
$V_a$, $V_b$, and $V_c$ are the voltages for phases a, b, and c
$I_a$, $I_b$, and $I_c$ are the voltages for phases a, b, and c
$Z_{aa}$, $Z_{bb}$, and $Z_{cc}$ are the impedance for phases a, b, and c, and $Z_{ab}$, $Z_{ba}$, $Z_{ac}$, $Z_{ca}$, $Z_{bc}$, and $Z_{bc}$ are the mutual impedances between phases a and b, phases a and c, and phases b and c.

Applying symmetrical component theory to Equation 1, the relationship between symmetrical components of voltage, current, and impedance, may be expressed as follows:

$$\begin{pmatrix} V_p \\ V_n \end{pmatrix} = \begin{pmatrix} Z_{pp} & Z_{pn} \\ Z_{np} & Z_{nn} \end{pmatrix} \begin{pmatrix} I_p \\ I_n \end{pmatrix} \qquad (2)$$

where:
$V_p$ is the positive sequence voltage
$V_n$ is the negative sequence voltage
$I_p$ is the positive sequence current
$I_n$ is the negative sequence voltage
$Z_{pp}$ is the positive sequence impedance
$Z_{nn}$ is the negative sequence impedance
$Z_{np}$ is the negative-to-positive differential impedance and
$Z_{pn}$ is the positive-to-negative differential impedance.

For an ideal motor 10, the off-diagonal elements of Equation 2 are zero, signifying decoupled positive and negative sequence component circuits for the motor 10. Based on Equation 2, the negative sequence voltage may be determined as follows:

$$V_n = Z_{nn}I_n + Z_{np}I_p \qquad (3)$$

Thus, based on a Equation 3, a normalized cross-coupled impedance with respect to negative sequence impedance $Z_{mn}$ may be determined as follows:

$$\frac{Z_{np}}{Z_{nn}} = \frac{\left(\frac{V_n}{Z_{nn}} - I_n\right)}{I_p} \qquad (4)$$

where
$Z_{np}/Z_{nn}$ is the normalized cross-coupled impedance with respect to negative sequence impedance.

In another embodiment, the normalized cross-coupled impedance may be normalized with respect to positive sequence impedance. The normalized cross-coupled impedance with respect to positive sequence impedance may be determined as follows:

$$\frac{Z_{np}}{Z_{pp}} = \frac{(V_n - Z_{nn}I_n)}{V_p} \qquad (5)$$

where
$Z_{np}/Z_{pp}$ is the normalized cross-coupled impedance with respect to positive sequence impedance.

The normalized cross-coupled impedance with respect to the positive sequence impedance may be used, in addition to the normalized cross-coupled impedance, with respect to the negative sequence impedance, to further enhance detection of a turn fault in the stator 16.

Figure 4:
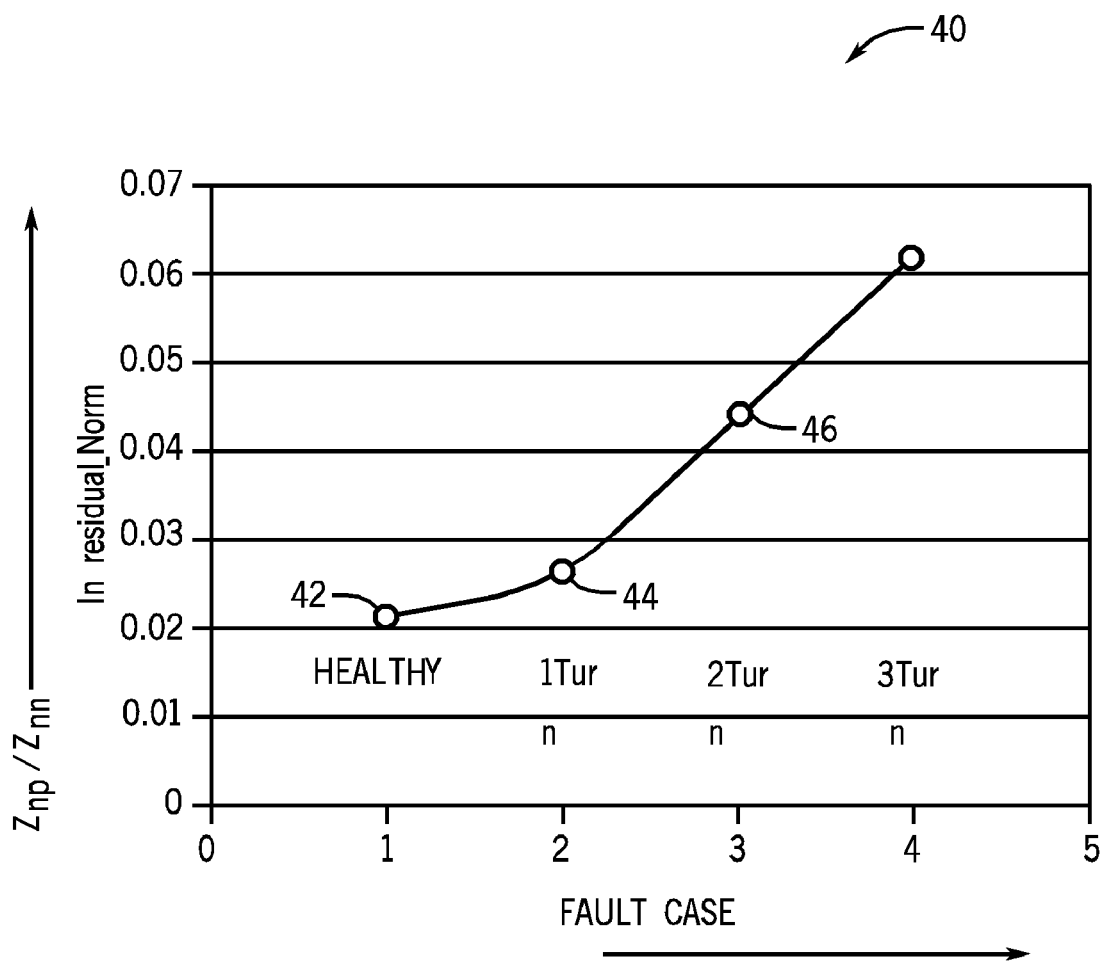
FIG. 4 is a graph of the relationship between negative sequence impedance turn faults in accordance with an embodiment of the present invention.

FIG. 4 is a graph 40 of the relationship between normalized cross-coupled impedance (with respect to negative sequence impedance) and the number of turn faults. The y-axis of the graph 40 is normalized cross-coupled impedance, $Z_{np}/Z_{nm}$, and the x-axis is the number of turn faults that may be present. As depicted in FIG. 4, a first point 42 corresponds to a $Z_{np}/Z_{nn}$ of about 0.02 and indicates a "healthy" motor, e.g., a motor that does not likely have any turn faults. A second point 44 corresponds to a normalized cross-coupled impedance of about 0.025, indicating the presence of about one turn fault. A third point 46 corresponds to a normalized cross-coupled impedance of about 0.045, indicating the likely presence of about two turn faults. As illustrated in the graph 40, an increase in the normalized cross-coupled impedance from the "healthy" value at the first point 42 corresponds to an increase in the likely number of turn faults of the motor 10. By comparing the normalized cross-coupled impedance to these correlated values, an indication of the number and/or severity of turn faults may be determined.

As described above in Equations 2-5, one parameter used in the determination of the normalized cross-coupled impedance is the negative sequence $Z_{nn}$. The negative sequence impedance $Z_{nn}$ may be determined using various techniques. In some embodiments, the negative sequence impedance $Z_{nn}$ may be determined using any one of, or a combination of, the following techniques: 1) computation using machine parameters; 2) measurement of the negative sequence impedance directly during commissioning by deliberate creation of unbalance; or 3) heuristic determination of the negative sequence impedance of the parameters of the motor 10.

In one embodiment, the heuristic determination may include a regression analysis to determine the relationship between the negative sequence impedance $Z_{nn}$ and the parameters of the motor 10. In one such embodiment, $Z_{nn}$ may be determined as a standstill impedance having a relationship that may be expressed as follows:

$$Z_{nn}=f(\text{HP},\text{Voltage},\text{Pole},\text{frequency},\text{size}) \quad (6)$$

where
HP is the rated horsepower of the motor 10
Pole is the number of poles of the motor 10
Voltage is the line-to-line voltage of the motor 10
frequency is the frequency of the motor 10 and
size is the size of the motor 10.

In such an embodiment, the regression analysis may be divided into a first analysis for low HP machines (less or equal to 500 HP) and a second analysis for high HP machines (greater than 500 HP). In this embodiment, the negative sequence impedance may be expressed as a non-linear higher order function of the parameters mentioned above. For example, the magnitude of $Z_{nn}$ may be expressed as follows:

$$Z_{reg}=A+B*HP+C*VLL+D*P+E*HP*VLL+F*HP*P+ \\ G*VLL*P+H*HP^2+I*VLL^2+J*P^2 \quad (7)$$

Where
A, B, C, D, E, F, G, H, I, and J are constants determined by the regression analysis
HP is the rated horsepower of the motor
VLL is the line-to-line voltage of the motor and
P is the number of poles.

Similarly, the phase of $Z_{nn}$ may be determined as follows:

$$Z_{ang\_reg}=A_1+B_1*HP+C_1*VLL+D_1*P+E_1*HP*VLL+ \\ F_1*HP*P+G_1*VLL*P+H_1*HP^2+I_1*VLL^2+J_1*P^2 \quad (8)$$

where
$A_1, B_1, C_1, D_1, E_1, F_1, G_1, H_1, I_1$, and $J_1$ are constants determined by the regression analysis.

Using the Equations 6 and 7, the negative sequence impedance may be determined for a motor 10 and stored in the memory 28 of the device 24. Accordingly, the negative sequence impedance $Z_{nn}$ and the symmetrical components for each current and voltage, derived from the measurements of voltages and currents of the motor 10, allow determination of the normalized cross-coupled impedances as discussed above in Equations 4 and 5.

Figure 5:
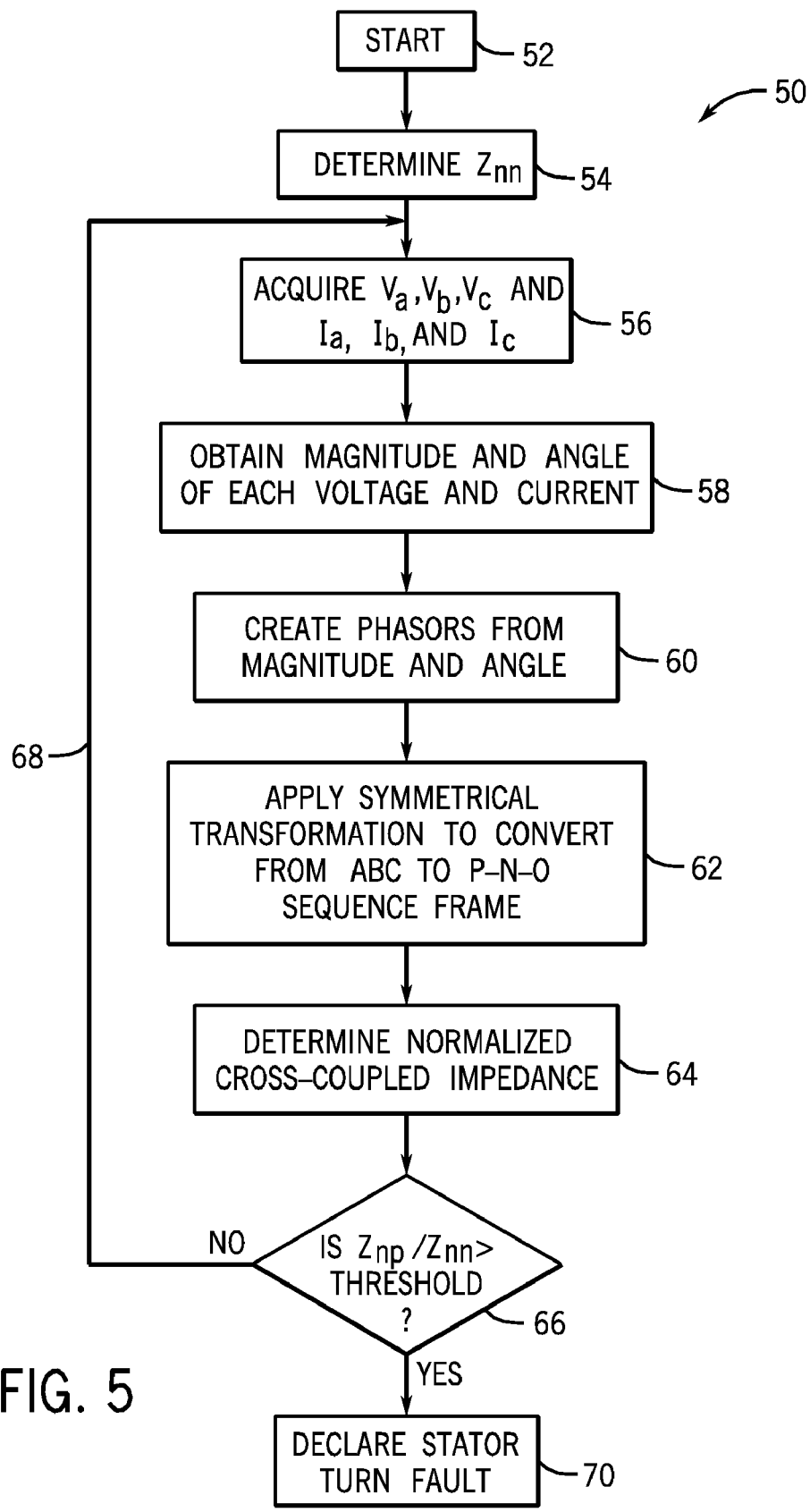
FIG. 5 depicts a process for determining a stator turn fault in accordance with an embodiment of the present invention.

FIG. 5 depicts an embodiment of a process 50 for determining a stator turn fault in accordance with an embodiment of the present invention. The process 50 starts upon start-up of the device 24, e.g., a relay, meter, or other suitable device, and the motor 10 (block 52). The standstill negative sequence impedance $Z_{nn}$ may be determined (block 54) via one of the three techniques discussed above (computation using machine parameters, direct measurement of the negative sequence impedance, or regression analysis of the negative sequence impedance).

The three phase voltages $V_a$, $V_b$, and $V_c$ and the three-phase currents Ia, Ib, and Ic are acquired from the transformers or other components on the motor 10 (block 56) and received by the device 24 or other device coupled to the motor 10. The voltages and currents may be passed through a single phase phase-locked loop (PLL) to obtain the magnitude and angle of each voltage $V_a$, $V_b$, and $V_c$ and each current Ia, Ib, and Ic (block 58). As will be appreciated, there can be other techniques of calculating magnitude and angle from instantaneous values. Embodiments may include a PLL or any other suitable technique. The magnitude and phase information of each voltage and current may be combined to create current and voltage phasors (block 60). As mentioned above, the device 24 may apply a symmetrical sequence transformation to convert voltages and currents from the a-b-c phase to the positive, negative and zero sequence frame (block 62).

The normalized cross-coupled impedance with respect to the negative sequence and/or the positive sequence may be determined as discussed above (block 64). Using the correlation provided above in FIG. 4, the normalized cross-coupled impedance (with respect to negative impedance) $Z_{np}/Z_{nn}$ may be compared to a threshold (decision block 66). If the normalized cross-coupled impedance is below the threshold, the process 50 may return to normal operation of the motor 10, as illustrated by line 68. If the normalized cross-coupled impedance is above the threshold, then a stator turn fault is likely present and the device 24 or other device coupled to the motor 10 may declare a stator turn fault (block 70).

Figure 6:
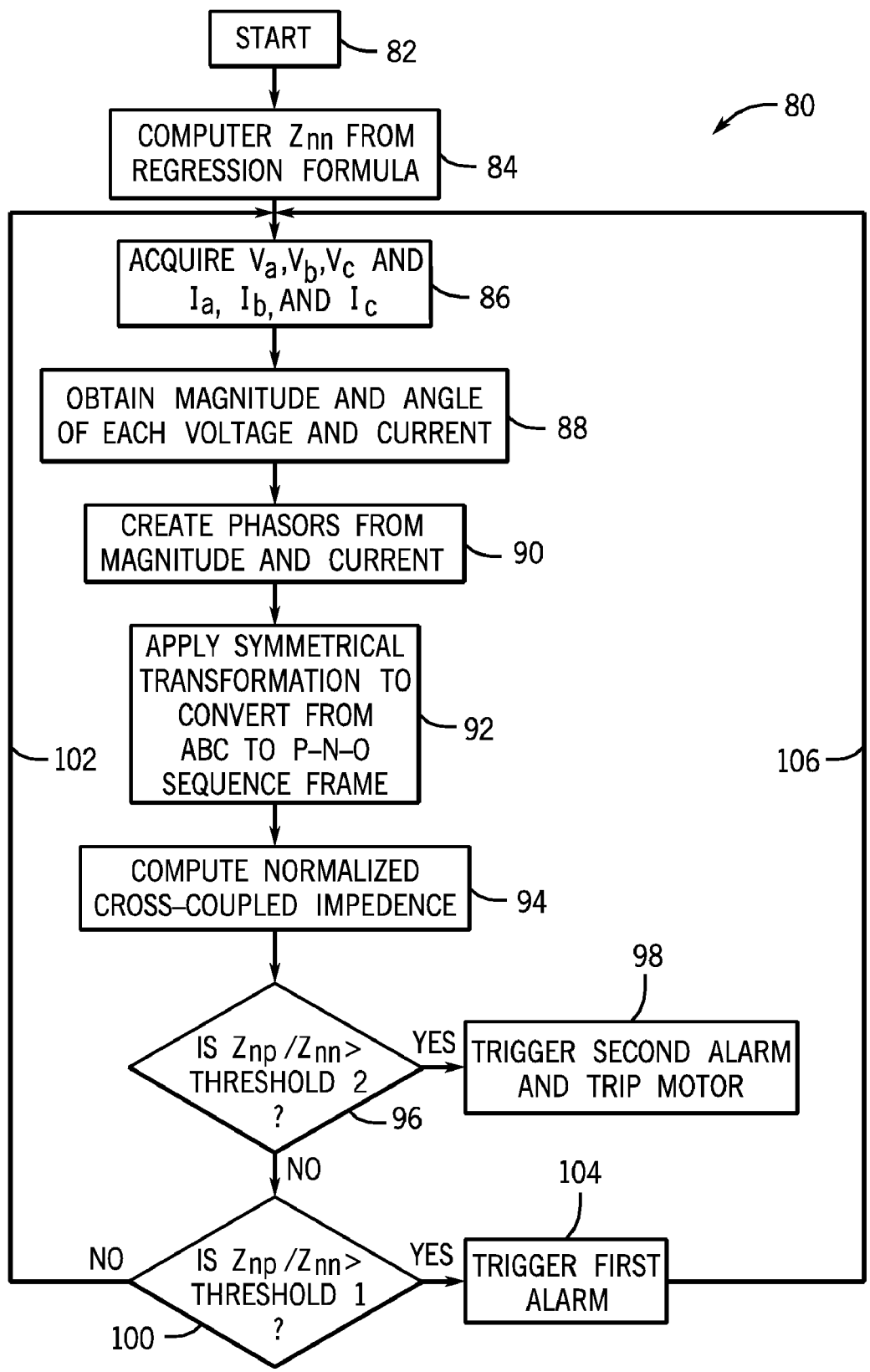
FIG. 6 depicts a process for responding to a stator turn fault in accordance with an embodiment of the present invention.

FIG. 6 depicts an embodiment of a process 80 for determining and responding to turn faults indicated by the normalized cross-coupled impedance. As described above, the start of the process 80 (block 82) may include starting the motor 10 and the device 24. In process 80, the standstill negative sequence impedance may be determined from the regression formulas presented above in Equations 7 and 8 (block 84) or any other technique mentioned above. Similar to the embodiment discussed above, the process 80 may include acquiring three-phase voltages and currents (block 86), obtaining magnitude and angle of each voltage and current though a single phase PLL or other techniques (block 88), and creating phasors from the magnitude and phase information (block 90).

The symmetrical components may be determined from the three-phase voltages and currents (block 92) and the normalized cross-coupled impedance with respect to negative sequence and/or positive sequence determined as discussed above (block 94). In this embodiment, the normalized cross-coupled impedance (with respect to negative impedance) $Z_{np}/Z_{nn}$ or $Z_{np}/Z_{pp}$ may be compared to different thresholds to determine the number and/or severity of the turn faults. For example, two thresholds may be used, referred to as Threshold 1 and Threshold 2, in which Threshold 2 is higher than Threshold 1 and indicates a greater number and/or severity of turn faults.

The normalized cross-coupled impedance may be compared to Threshold 2, (decision block 96) that is indicative of multiple and/or more severe turn faults. If the normalized cross-coupled impedance is greater than Threshold 2, the process 80 may trigger a second alarm and trip the motor 10, disabling the operation of the motor 10 (block 98).

If the normalized cross-coupled impedance is below Threshold 2, then the process 80 compares the normalized cross-coupled impedance to Threshold 1 (decision block 100). If the normalized cross-coupled impedance is below Threshold 1, the process 80 continues normally, as indicated by arrow 102. If the normalized cross-coupled impedance is above Threshold 1, then a first alarm may be triggered (block 104). After triggering the first alarm the process 80 continues normally, as indicated by arrow 106. In other embodiments, any number of thresholds may be used to indicate various numbers and/or severity of turn faults, such as three thresholds, four thresholds, five thresholds, etc. In some embodiments, the alarm may be something specific to the user or the user's choice.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for determining turn faults in an induction motor, comprising:
   determining a negative sequence voltage;
   determining a negative sequence current and a positive sequence current;
   determining a negative sequence impedance;
   determining a normalized cross-coupled impedance from the negative sequence voltage, negative sequence current, positive sequence current, and negative sequence impedance; and
   determining whether the normalized cross-coupled impedance indicates the presence of a turn fault.

2. The method of claim 1, wherein determining whether the normalized cross-coupled impedance indicates the presence of a turn fault comprises comparing the normalized cross-coupled impedance to a threshold.

3. The method of claim 2, comprising comparing the normalized cross-coupled impedance to a first threshold to indicate a one turn fault, a second threshold to indicate two turn faults, and a third threshold to indicate three turn faults.

4. The method of claim 1, comprising providing an alarm if the normalized cross-coupled impedance indicates the presence of a turn fault.

5. The method of claim 3, comprising providing a first alarm if the normalized cross-coupled impedance indicates the presence of one turn fault, a second alarm if the normalized cross-coupled impedance indicates the presence of two turn faults, and a third alarm if the normalized cross-coupled impedance indicates the presence of three turn faults.

6. The method of claim 1, wherein determining the negative sequence impedance comprises determining the negative sequence impedance from a plurality of parameters of the induction motor.

7. The method of claim 6, wherein the plurality of parameters comprises rated horsepower of the induction motor, poles of the induction motor, and rated voltage of the induction motor.

8. A system for determining turn faults in an induction motor, comprising:
   a device coupled to the induction motor and configured to determine a negative sequence voltage, a negative sequence current and a positive sequence current, the device comprising a memory;
   wherein the memory comprises instructions for:
      determining a normalized cross-coupled impedance, wherein the normalized cross-coupled impedance comprises a differential impedance normalized by the negative sequence impedance; and
      determining the normalized cross-coupled impedance indicates the presence of a turn fault.

9. The system of claim 8, wherein the memory comprises instructions for comparing the normalized cross-coupled impedance to a threshold.

10. The system of claim 8, comprising a switch configured to disconnect the motor if the normalized cross-coupled impedance indicates the presence of a turn fault.

11. The system of claim 8, wherein the device comprises a relay.

12. The system of claim 8, wherein the device comprises a meter.

13. The system of claim 8, wherein the memory comprises instructions for determining the negative sequence impedance from a plurality of parameters of the induction motor.

14. A method for determining turn faults in an induction motor, comprising:
   determining a negative sequence voltage;
   determining a negative sequence current and a positive sequence voltage;
   determining a negative sequence impedance;
   determining a normalized cross-coupled impedance from the negative sequence voltage, negative sequence current, positive sequence positive, and negative sequence impedance; and
   determining whether the normalized cross-coupled impedance indicates the presence of a turn fault.

15. The method of claim 14, wherein determining whether the normalized cross-coupled impedance indicates the presence of a turn fault comprises comparing the normalized cross-coupled impedance to a threshold.

16. The method of claim 14, comprising instructions for providing an alarm if the normalized cross-coupled impedance indicates the presence of a turn fault.

17. The method of claim 14, wherein determining the negative sequence impedance comprises determining the negative sequence impedance from a plurality of parameters of the induction motor.

18. A method for determining turn faults in an induction motor, comprising:
   determining a normalized cross-coupled impedance;
   comparing the normalized cross-coupled impedance to a first threshold; and
   if the normalized cross-coupled impedance is greater than the first threshold, triggering a first alarm.

19. The method of claim 18, comprising comparing the normalized cross-coupled impedance to a second threshold; and if the normalized cross-coupled impedance is greater than the second threshold, triggering a second alarm.

20. The method of claim 19, comprising comparing the normalized cross-coupled impedance to a third threshold; and if the normalized cross-coupled impedance is greater than the third threshold, shutting down the motor.

* * * * *